(12) United States Patent
Tanaka et al.

(10) Patent No.: US 8,080,873 B2
(45) Date of Patent: Dec. 20, 2011

(54) SEMICONDUCTOR DEVICE, SEMICONDUCTOR PACKAGE, AND METHOD FOR TESTING SEMICONDUCTOR DEVICE

(75) Inventors: Hiroyuki Tanaka, Kasugai (JP); Yoshito Ito, Kasugai (JP); Akinori Sekiyama, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 242 days.

(21) Appl. No.: 11/124,262

(22) Filed: May 9, 2005

(65) Prior Publication Data

US 2005/0200005 A1    Sep. 15, 2005

Related U.S. Application Data

(62) Division of application No. 10/347,868, filed on Jan. 22, 2003, now Pat. No. 6,909,172.

(30) Foreign Application Priority Data

Jun. 27, 2002   (JP) .................................. 2002-187994

(51) Int. Cl.
*H01L 23/34*     (2006.01)

(52) U.S. Cl. ................ 257/723; 257/685; 257/E25.013

(58) Field of Classification Search .................. 257/685, 257/686, 723, 777, 724, 731, 734, 782, 783, 257/784, 773, 786, 684, E25.006, E25.013, 257/E25.021, E25.027, E21.614; 714/733, 714/718, 724, 738

See application file for complete search history.

(56) References Cited

U.S. PATENT DOCUMENTS

| | | | |
|---|---|---|---|
| 5,528,083 A | 6/1996 | Malladi et al. | |
| 6,441,669 B2 | 8/2002 | Ooishi | |
| 6,473,321 B2 * | 10/2002 | Kishimoto et al. | ............. 363/59 |
| 6,476,506 B1 | 11/2002 | O'Connor et al. | |
| 6,831,502 B1 | 12/2004 | Oishi | |
| 2001/0000013 A1 * | 3/2001 | Lin | ................ 257/777 |
| 2002/0171451 A1 * | 11/2002 | Hamano et al. | ................ 326/41 |
| 2003/0197515 A1 * | 10/2003 | Ishigaki | ................ 324/538 |

FOREIGN PATENT DOCUMENTS

| | | |
|---|---|---|
| JP | 10-027026 | 1/1998 |
| JP | 2003-185710 | 7/2003 |
| JP | 2003-309183 | 10/2003 |

\* cited by examiner

*Primary Examiner* — Ngan Ngo
*Assistant Examiner* — Dilinh Nguyen
(74) *Attorney, Agent, or Firm* — Arent Fox LLP

(57) ABSTRACT

A semiconductor device designed to facilitate testing. Superimposed first and second semiconductor chips each include a plurality of internal terminals, an external terminal, and a plurality of transistors. A plurality of wires connect the internal terminals, the transistors, and the external terminals of the first and second semiconductor chips in series.

14 Claims, 4 Drawing Sheets

US 8,080,873 B2

SEMICONDUCTOR DEVICE, SEMICONDUCTOR PACKAGE, AND METHOD FOR TESTING SEMICONDUCTOR DEVICE

This is a Divisional of U.S. patent application Ser. No. 10/347,868, which was filed on Jan. 22, 2003 now U.S. Pat. No. 6,909,172, and is entitled "SEMICONDUCTOR DEVICE, SEMICONDUCTOR PACKAGE, AND METHOD FOR TESTING SEMICONDUCTOR DEVICE", the disclosure of which is hereby incorporated by reference herein in its entirety.

CROSS-REFERENCED TO RELATED APPLICATIONS

This application is based upon and claims the benefit of priority from the prior Japanese Patent Application No. 2002-187994, filed on Jun. 27, 2002, the entire contents of which are incorporated herein by reference.

BACKGROUND OF THE INVENTION

The present invention relates to a semiconductor device, a semiconductor package, and a method for testing a semiconductor device.

A multi-chip package (MCP) includes multiple chips having various functions. Such a multi-chip package is becoming popular since semiconductor chips are becoming more compact. An MCP that includes chips provided with the functions of a memory or a logic circuit, which are connected to each other by a wiring, is referred to as a system-in-package (SIP).

In an MCP, the number of terminals connecting chips (i.e., the number of terminals per chip) is increased to widen the bus and improve data transfer efficiency. The increase in the number of terminals causes the testing of the MCP that is conducted subsequent to the assembly of the package to become complicated. Accordingly, the testing of the MCP must be conducted with higher efficiency and accuracy.

An external terminal of a chip, which is installed on the MCP, is used to conduct the MCP testing. Deficient MCPs are located through the MCP testing. Only MCPs functioning normally pass the test and become final products.

In the conventional MCP testing, the location of deficient MCPs is performed in package units. Thus, there is no way to tell whether the deficiency is due to a chip of the MCP or due to the connection of the chips. As a result, when there is a flaw in the connection between chips, an MCP is determined as being deficient even though the chips are functioning normally. In this manner, in the conventional MCP testing, the cause of the MCP deficiency cannot be located. Thus, such an MCP is destroyed without remediating the deficient location. This is an obstacle for increasing the yield of the MCPs.

SUMMARY OF THE INVENTION

It is an object of the present invention to provide a semiconductor device and semiconductor package designed to facilitate testing and a testing method that improves the accuracy for testing a semiconductor device.

To achieve the above object, the present invention provides a semiconductor device including a plurality of semiconductor chips connected to each other by a plurality of wires. Each of the semiconductor chips includes a plurality of internal terminals connected to the plurality of wires, a first external terminal, and a second external terminal. The plurality of internal terminals including a first internal terminal adjacent to the first external terminal, and a second internal terminal adjacent to the second external terminal. An intermediate switch device is connected between the plurality of internal terminals so that the plurality of wires and the internal terminals are connected in series. A first end switch device is connected between the first internal terminal and the first external terminal. A second end switch device is connected between the second internal terminal and the second external terminal.

A further aspect of the present invention is a semiconductor device comprising at least two semiconductor chips, each having a plurality of internal terminals with the internal terminals of the two semiconductor chips connected to one another by a plurality of wires. Each of the semiconductor chips includes at least one redundant terminal. A test circuit detects whether there is an internal terminal causing a connection flaw and for generating a plurality of test signals, each corresponding to one of the plurality of internal terminals. A switching circuit unit for switching a first set of the plurality of internal terminals including the internal terminal causing a connection flaw to a second set of the plurality of internal terminals excluding the internal terminal causing a connection flaw and the at least one redundant terminal.

A further aspect of the present invention is a semiconductor device including at least two semiconductor chips, each having a plurality of internal terminals. Each of the semiconductor chips includes at least one redundant terminal. A test circuit detects whether there is an internal terminal causing a connection flaw and for generating a plurality of test signals, each corresponding to one of the plurality of internal terminals. A switching circuit unit switches the internal terminal causing a connection flaw to the at least one redundant terminal.

A further aspect of the present invention is a semiconductor device including two semiconductor chips, each having a plurality of internal terminals, a first external terminal, and a second external terminal. The plurality of internal terminals include a first internal terminal adjacent to the first external terminal, and a second internal terminal adjacent to the second external terminal with the internal terminals of the two semiconductor chips connected to one another by a plurality of wires. Each of the semiconductor chips including at least one redundant terminal. A test circuit detects whether there is an internal terminal causing a connection flaw and for generating a plurality of test signals, each corresponding to one of the plurality of internal terminals. A switching circuit unit switches a first set of the plurality of internal terminals including the internal terminal causing a connection flaw to a second set of the plurality of internal terminals excluding the internal terminal causing a connection flaw and the at least one redundant. An intermediate switch device connected between the plurality of internal terminals so that the plurality of wires and the internal terminals are connected in series. A first end switch device is connected between the first internal terminal and the first external terminal. A second end switch device connected between the second internal terminal and the second external terminal.

A further aspect of the present invention is a semiconductor device including at least two semiconductor chips, each having a plurality of internal terminals, a first external terminal, and a second external terminal. The plurality of internal terminals include a first internal terminal adjacent to the first external terminal and a second internal terminal adjacent to the second external terminal. Each of the semiconductor chips includes at least one redundant terminal, a test circuit for detecting whether there is an internal terminal causing a connection flaw and for generating a plurality of test signals, each corresponding to one of the plurality of internal terminals. A switching circuit unit switches the internal terminal causing a connection flaw to the at least one redundant terminal. An intermediate switch device is connected between the plurality of internal terminals so that the plurality of wires and the internal terminals are connected in series. A first end switch device is connected between the first internal terminal and the first external terminal. A second end switch device is connected between the second internal terminal and the second external terminal.

A further aspect of the present invention is a semiconductor package including a semiconductor device. The semiconductor device includes a plurality of semiconductor chips connected to each other by a plurality of wires with each of the semiconductor chips including a plurality of internal terminals connected to the plurality of wires. An intermediate switch device is connected between the plurality of internal terminals so that the plurality of wires and the internal terminals are connected in series. A first end switch device is connected between the first internal terminal and the first external terminal. A second end switch device is connected between the second internal terminal and the second external terminal.

A further aspect of the present invention is a semiconductor package including a semiconductor device including at least two semiconductor chips. Each semiconductor chip includes a plurality of internal terminals with the internal terminals of the two semiconductor chips connected to one another by a plurality of wires, at least one redundant terminal, and a test circuit for detecting whether there is an internal terminal causing a connection flaw and for generating a plurality of test signals, each corresponding to one of the plurality of internal terminals. A switching circuit unit switches a first set of the plurality of internal terminals including the internal terminal causing a connection flaw to a second set of the plurality of internal terminals excluding the internal terminal causing a connection flaw and the at least one redundant terminal.

A further aspect of the present invention is a method for testing a semiconductor device. The semiconductor device includes a plurality of semiconductor chips connected to each other by a plurality of wires, each of the semiconductor chips including an external terminal and a plurality of internal terminals connected to the plurality of wires. The method includes connecting the wires and the internal terminals in series, connecting a first end switch device between the first internal terminal and the first external terminal, connecting a second end switch device between the second internal terminal and the second external terminal, testing conduction between the first external terminal and the second external terminal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A multi-chip package (MCP) according to a first embodiment of the present invention will now be discussed.

Figure 1:
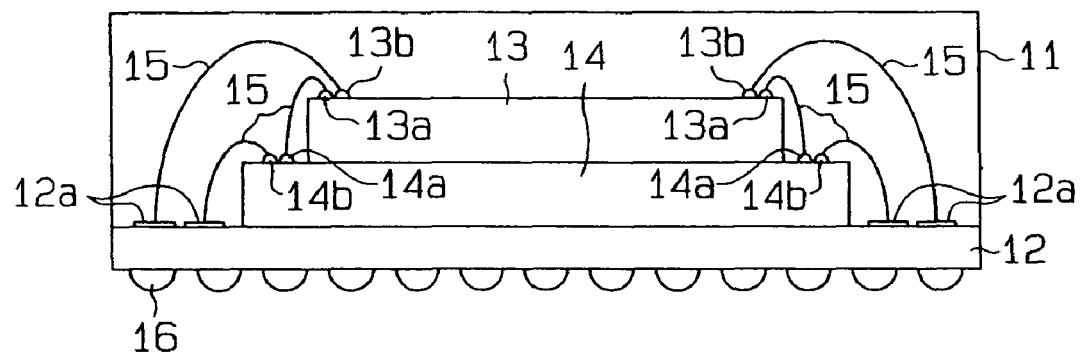
FIG. 1 is a schematic diagram of an MCP according to a first embodiment of the present invention.

Referring to FIG. 1, the MCP 11 is a stack type MCP, in which a semiconductor device including a plurality of semiconductor chips 13, 14 is arranged on a substrate 12. The chips 13, 14 have a plurality of internal terminals 13a, 14a, respectively. The internal terminals 13a, 14a are connected to one another by wires 15. Further, the chips 13, 14 have a plurality of external terminals 13b, 14b, respectively. The external terminals 13b, 14b are connected to a plurality of substrate terminals 12a, which are arranged on the substrate 12, by wires 15. A plurality of electrodes (solder balls) 16 are arranged on the bottom portion of the substrate 12. The MCP 11 is connected to a further substrate (not shown) by means of the electrodes 16.

Figure 2:
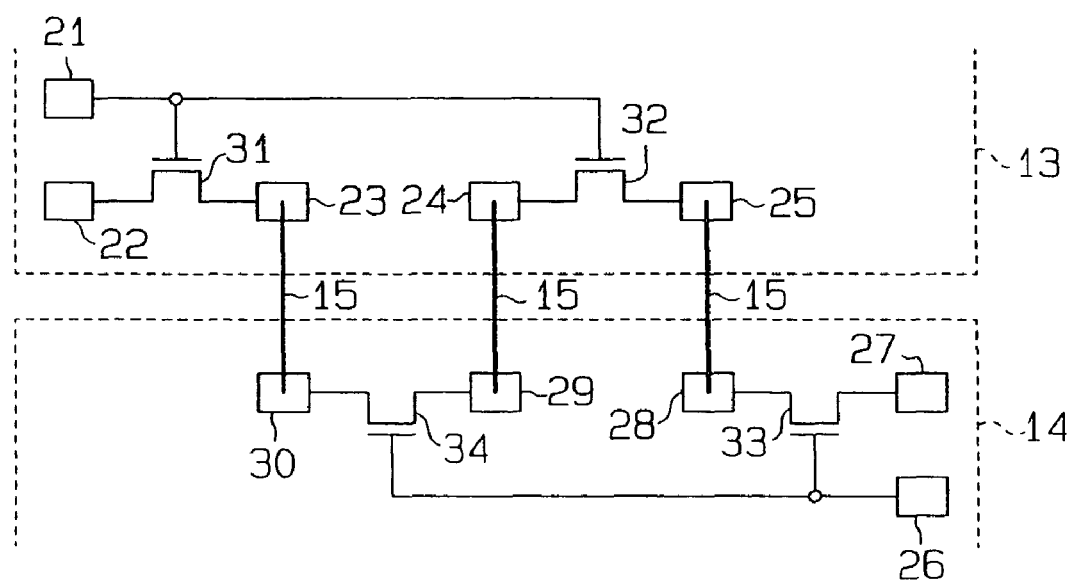
FIG. 2 is a schematic diagram of a circuit for detecting a connection flaw.

Referring to FIG. 2, the detection of a flaw in the connection between the first chip 13 and the second chip 14 of the MCP 11 will now be discussed.

The first chip 13 includes two external terminals 21, 22, which correspond to the external terminals 13b of FIG. 1, and three internal terminals 23 to 25, which correspond to the internal terminals 13a of FIG. 1. The second chip 14 includes external terminals 26, 27, which correspond to the external terminals 14b of FIG. 1, and internal terminals 28 to 30, which correspond to the internal terminals 14a of FIG. 1. The internal terminals 23, 24, 25 of the first chip 13 are respectively connected to the internal terminals 30, 29, 28 of the second chip 14 by means of the wires 15 (three shown in FIG. 2). The external terminal 21 of the first chip 13 and the external terminal 26 of the second chip 14 are control external terminals. The external terminal 22 of the first chip 13 and the external terminal 27 of the second chip 14 are conductive external terminals.

The first chip 13 includes switch devices, or n-channel MOS transistors 31, 32. The end transistor 31 connects the external terminal 22 and the internal terminal 23, and the intermediate transistor 32 connects the two internal terminals 24, 25. The gates of the transistors 31, 32 are connected to the external terminal 21.

The second chip 14 includes switch devices, or n-channel MOS transistors 33, 34. The end transistor 33 connects the external terminal 27 and the internal terminal 28, and the intermediate transistor 34 connects the two internal terminals 29, 30. The gates of the transistors 33, 34 are connected to the external terminal 26.

The internal terminals 23-25 and 28-30, the transistors 31-34, and the wires 15 are connected in series between the external terminal 22 of the first chip 13 and the external terminal 27 of the second chip 14.

The transistors 31-34 are activated when the external terminals 21, 26 are provided with a signal having a high level. This causes the two external terminals 22, 27 to become conductive by means of the transistors 31-34, the internal terminals 23-25, 28-30, and the wires 15. Accordingly, a flaw in the connection between the first chip 13 and the second chip 14, or a connection flaw of the wires 15, may be detected by performing a conduction test on the MCP 11.

Figure 3:
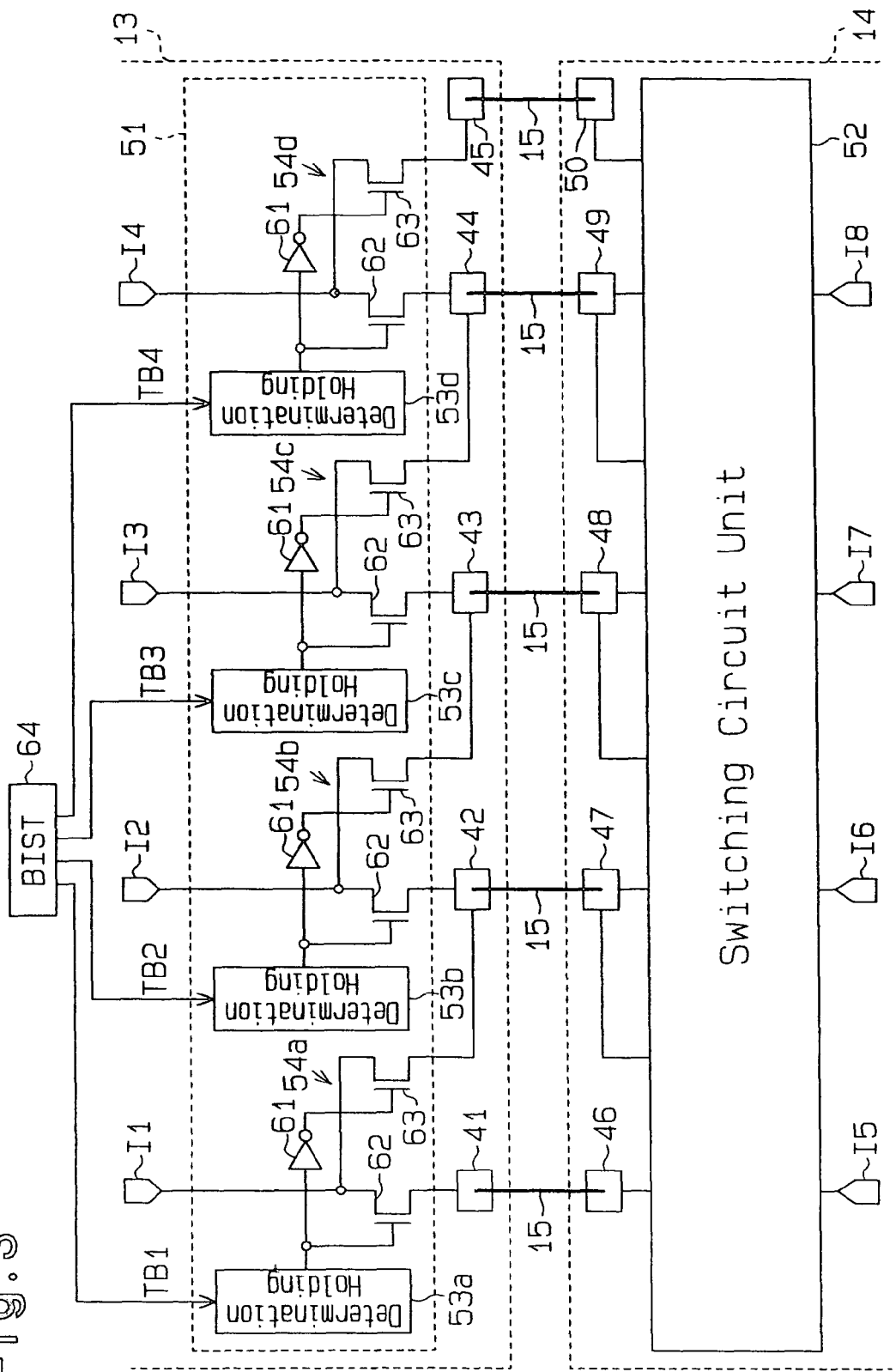
FIG. 3 is a schematic diagram of a circuit for remediating a connection flaw.

The remediation of a connection flaw using a redundancy function will now be discussed with reference to FIG. 3.

The first chip 13 includes terminals 41 to 44, which correspond to the internal terminals 13a of FIG. 1, and at least one redundant terminal 45, which is used to remediate a connection flaw. The second chip 14 includes terminals 46 to 49, which correspond to the internal terminals 14a of FIG. 1, and at least one redundant terminal 50, which is used to remediate a connection flaw. The number of the redundant terminals 45 of the first chip 13 is the same as the number of the redundant terminals 50 of the second chip 14. FIG. 3 does not show a configuration for detecting the connection flaw of FIG. 2.

The internal terminals 41-44 and the redundant terminal 45 of the first chip 13 are respectively connected to the internal terminals 46-49 and the redundant terminal 50 of the second chip 14 by wires 15.

The internal terminals 41-44 and the redundant terminal 45 of the first chip 13 are connected to a first switching circuit unit 51. The first switching circuit unit 51 is connected to input/output terminals I1 to I4 of an internal circuit (not shown). The internal terminals 46-49 and the redundant terminal 50 of the second chip 14 are connected to a second switching circuit unit 52. The second switching circuit unit 52 is connected to input/output terminals I5 to I8 of an internal circuit (not shown).

The first switching circuit unit 51 will now be discussed. The configurations of the first and second switching circuit units 51, 52 are the same. Thus, the second switching circuit unit 52 will not be discussed in detail.

The first switching circuit unit 51 includes first to fourth determination result holding circuits 53a, 53b, 53c, 53d and first to fourth switch circuits 54a, 54b, 54c, 54d, which are respectively connected to the determination result holding circuits 53a-53d. The determination result holding circuits 53a-53d are respectively arranged in correspondence with the internal terminals 41-44 of the first chip 13. FIG. 3 illustrates the four determination result holding circuits 53a-53d and the four internal terminals 41-44.

Each of the first to fourth switch circuits 54a-54d includes an inverter circuit 61, a first transistor 62, and a second transistor 63. The first and second transistors 62, 63 are n-channel MOS transistors.

The first transistor 62 is connected to the input/output terminal I1 and the internal terminal 41. The output signal of the first determination result holding circuit 53a is input to the gate of the first transistor 62. The second transistor 63 is connected to the input/output terminal I1 and the internal terminal 42. The output signal of the first determination result holding circuit 53a is input to the gate of the second transistor 63 via the inverter circuit 61. The first switch circuit 54a switches the terminal to which the input/output terminal I1 is connected to either one of the input terminals 41, 42 in accordance with the output signal of the first determination result holding circuit 53a.

The second switch circuit 54b switches the terminal to which the input/output terminal I2 is connected to either one of the input terminals 42, 43 in accordance with the output signal of the second determination result holding circuit 53b. The third switch circuit 54c switches the terminal to which the input/output terminal I3 is connected to either one of the input terminals 43, 44 in accordance with the output signal of the third determination result holding circuit 53c.

In the fourth circuit 54d, the first transistor 62' is connected to the input/output terminal I4 and the internal terminal 44. The output signal of the fourth determination result holding circuit 53d is input to the gate of the first transistor 62. The second transistor 63 is connected to the input/output terminal I4 and the redundant terminal 45. The output signal of the fourth determination result holding circuit 53d is input to the gate of the second transistor 63 via the inverter circuit 61. Therefore, the fourth switch circuit 54d switches the terminal to which the input/output terminal I4 is connected to either one of the input terminal 44 and the redundant terminal 45 in accordance with the output signal of the fourth determination result holding circuit 53d.

A built-in self test (BIST) circuit 64, which is incorporated in the first chip 13, detects a flaw in the connection between the first chip 13 and the second chip 14 (i.e., detects deficient terminals in the first chip 13 and the second chip 14) and generates test signals TB1 to TB4 in accordance with the detection result. The first to fourth determination result holding circuits 53a-53d respectively receive the test signals TB1-TB4 from the BIST circuit 64.

Figure 4:
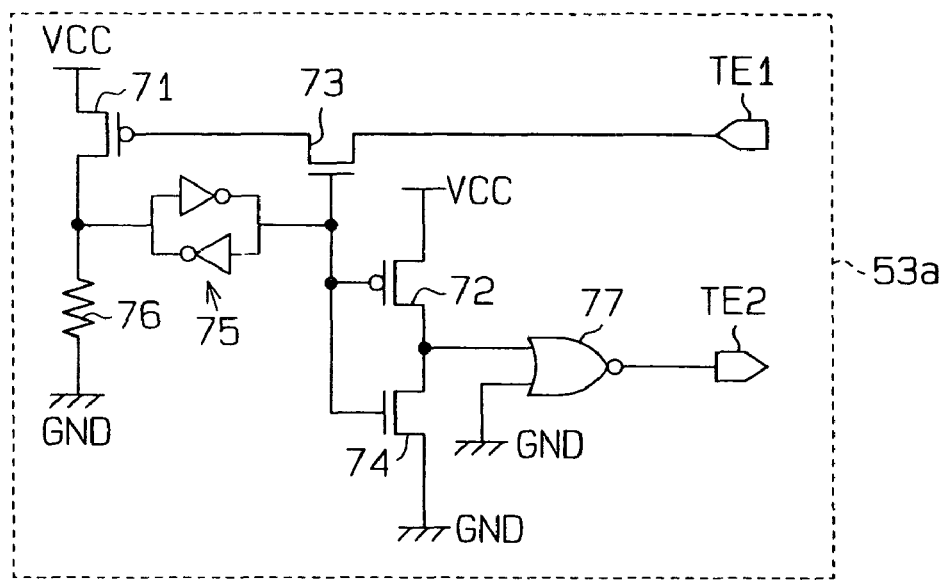
FIG. 4 is a circuit diagram of a determination result holding circuit.

Referring to FIG. 4, the first determination result holding circuit 53a includes p-channel MOS transistors 71, 72, n-channel MOS transistors 73, 74, a flip-flop circuit 75, a resistor 76, and a NOR circuit 77. The second to fourth determination result holding circuits 53b-53d are configured in the same manner as the first determination result holding circuit 53a and thus will not be described.

The source of the transistor 71 is connected to a power supply VCC, and the drain of the transistor 71 is connected to the ground GND via the resistor 76. The gate of the transistor 71 is connected to an input terminal TE1 of the first determination result holding circuit 53a. The gate of the transistor 73 is connected to a node between the transistor 71 and the resistor 76 via the flip-flop circuit 75 and to the gates of the transistors 72, 74. The source of the transistor 72 is connected to the power supply VCC, and the drain of the transistor 74 is connected to the drain of the transistor 74. The source of the transistor 74 is connected to the ground GND. The NOR circuit 77 has two input terminals, one of which is connected to a node between the transistors 72, 74 and the other one of which is connected to the ground GND. The output signal of the NOR circuit 77 is the output signal of the first determination result holding circuit 53a and is output from the output terminal TE2.

Normally, the BIST circuit 64 provides the input terminal TE1 of the first determination result holding circuit 53a with a signal having a high level. Further, the transistor 71 is inactivated, the flip-flop circuit 75 outputs a signal having a high level, and the transistor 74 is activated. Accordingly, the NOR circuit 77 outputs a signal having a high level to the output terminal TE2.

From this state, when the BIST circuit 64 provides the input terminal TE1 with a signal having a low level, the low signal is input to the gate of the transistor 71 via the transistor 73 and activates the transistor 71. As a result, the flip-flop circuit 75 outputs a signal having a low level and activates the transistor 72. Accordingly, the NOR circuit 77 outputs a signal having a low level from the output terminal TE2.

In this state, the transistor 73 is inactivated even if the input terminal TE1 receives a high level signal. Thus, the flip-flop circuit 75 outputs the low signal. Accordingly, the NOR circuit 77 outputs a signal that is held at a low level from the output terminal TE2.

Figure 5:
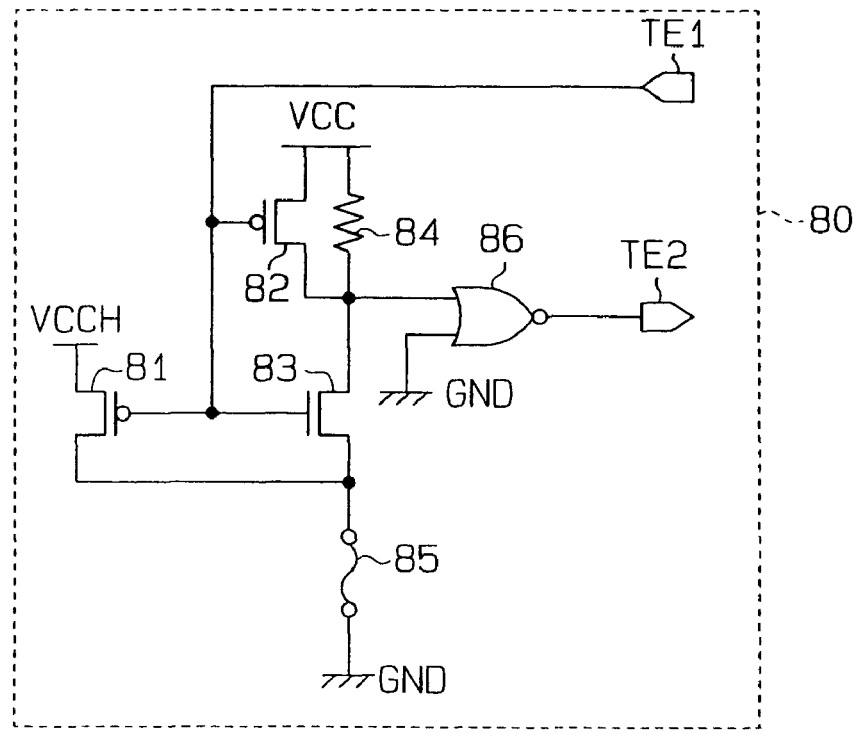
FIG. 5 is a circuit diagram of a determination result holding circuit in a further embodiment of the present invention.

Each of the first to fourth determination result holding circuits 53a-53d may be replaced by a determination result holding circuit 80 illustrated in FIG. 5. The determination result holding circuit 80 includes p-channel MOS transistors 81, 82, an n-channel MOS transistor 83, a resistor 84, a fuse 85, and a NOR circuit 86.

The source of the transistor 81 is connected to a power source VCCH, and the drain of the transistor 81 is connected to the ground GND via the source of the transistor 83 and the fuse 85. The gate of the transistor 81 is connected to the gates of the transistors 82, 83. The gates of the transistor 81 are connected to the gates of the transistors 82, 83. Further, the gates of the transistors 81, 82, 83 are connected to the input terminal TE1. The source of the transistor 82 is connected to the power source VCC, and the drain of the transistor 82 is connected to the drain of the transistor 83. The drain of the transistor 83 is connected to the power supply VCC via the resistor 84. The NOR circuit 86 has two input terminals, one of which is connected to a node between the transistors 82, 83 and the other of which is connected to the ground GND. The output signal of the NOR circuit 86 is the output signal of the determination result holding circuit 80 and is output from the output terminal TE2.

When the input terminal TE1 of the determination result holding circuit 80 receives a signal having a high level, the transistor 83 is activated. As a result, the NOR circuit 86 outputs a signal having a high level. When a signal having a low level is input to the input terminal TE1, the transistors 81, 82 are activated, and the NOR circuit 86 outputs a signal having a low level. In this state, the high voltage of the power supply VCCH is applied to the fuse 85 via the activated transistor 81. This breaks the fuse 85.

After the fuse 85 is broken, the signal output by the NOR circuit 86 is not high since the fuse 85 is broken even if the input terminal TE1 receives the high signal again. Accordingly, the determination result holding circuit 80 holds the low or high signal output from the BIST circuit 64 and outputs the held signal from the output terminal TE2.

The first switching circuit unit 51 will now be discussed with reference to FIG. 3.

A case in which a connection flaw is not detected during the conduction test, that is, a case in which the wires 15 are connecting terminals in a normal manner will now be discussed.

In this case, the BIST circuit 64 outputs a signal having a high level to the first to fourth determination result holding circuits 53*a*-53*d*. Each of the determination result holding circuits 53*a*-53*d* holds the high signal and outputs the held signal. This activates the first transistors 62 of the first to fourth switch circuits 54*a*-54*d* and connects the input/output terminals I1-I4 respectively to the internal terminals 41-44.

In this state, the second switching circuit unit 52 switches the connection of the terminals in response to the output signal from the BIST circuit (not shown) of the second chip 14. In this manner, when a connection flaw is not detected, the redundant terminals 45, 50 of the first and second chips 13, 14 are not used.

A case in which there is a flaw in the connection between the internal terminals 43, 48, that is, a case in which the internal terminals 43, 48 are deficient will now be discussed.

In this case, the BIST circuit 64 of the first chip 13 outputs a signal having a high level to the first and second determination result holding circuits 53*a*, 53*b* and a signal having a low level to the third and fourth determination result holding circuits 53*c*, 53*d*. This activates the first transistors 62 of the first and second switch circuit 54*a*, 54*b* and connects the input/output terminals I1-I2 respectively to the internal terminals 41-42. Further, the input/output terminal I3 is connected to the internal terminal 44 and not the deficient internal terminal 43, and the input/output terminal I4 is connected to the redundant terminal 45.

In this state, the second switching circuit unit 52 switches the connection of the terminals so that the input/output terminals I5-I8 are respectively connected to the internal terminals 46, 47, 49 and the redundant terminal 50 in response to the output signal from the BIST circuit (not shown) of the second chip 14.

The first embodiment has the advantages described below.

(1) The wires 15 connect the transistors 31-34 in series between the external terminals 22, 27 of the first and second chips 13, 14. The transistors 31-34 are activated and inactivated by means of the external terminals 21, 26 of the first and second chips 13, 14. Accordingly, the connection of the first and second chips 13, 14 are electrically tested with the external terminals 21, 22, 26, 27 of the first and second chips 13, 14. The conduction test enables detection of connection flaws between the first and second chips 13, 14 of the MCP 11. This improves the testing accuracy of the MCP 11.

(2) The conduction test is performed without actually activating the device. Thus, connection flaws caused by the wires 15 (wire open abnormality) are easily detected.

(3) When a connection flaw between the first and second chips 13, 14 is detected in the conduction test, the deficient terminal is compensated for by the redundant terminals 45, 50. This increases the yield of the MCP 11.

A second embodiment according to the present invention will now be discussed with reference to FIG. 6.

An MCP 11 of the second embodiment includes switching circuit units 101, 102, which differ from those of the first embodiment. The first chip 13 includes internal terminals 91 to 93 and a redundant terminal 94. The second chip 14 includes internal terminals 95 to 97 and a redundant terminal 98.

The internal terminals 91-93 and redundant terminal 94 of the first chip 13 are respectively connected to the internal terminals 95-97 and redundant terminal 98 of the second chip 14 by wires 15.

In the first chip 13, the internal terminals 91-93 and the redundant terminal 94 are connected to the input/output terminals I11 to I13 via a first switching circuit unit 101. In the second chip 14, the internal terminals 95-97 and the redundant terminal 98 are connected to the input/output terminals I14 to I16 via a second switching circuit unit 102. The configurations of the first and second switching circuit units 101, 102 are the same.

The first switching circuit unit 101 will now be discussed.

The first switching circuit unit 101 includes first to third determination circuits 103*a* to 103*c*, first to third switch circuits 104*a* to 104*c*, which are respectively associated with the determination circuits 103*a*-103*c*, and inverter circuits 105*a*, 105*b*, which are connected to the redundant terminal 94. Each of the switch circuits 104*a*-104*c* includes n-channel MOS transistors 111 to 115 and inverter circuits 116 to 118.

The test signal TB11 of a BIST circuit (not shown) is input to the gate of the transistors 111, 112 of the first switch circuit 104*a*. The test signal TB11 is also input to the gates of the transistors 113, 114 via the inverter circuit 116. Accordingly, the transistors 111, 112 and the transistors 113, 114 are activated and inactivated in a complementary manner in accordance with the level of the test signal TB11 of the BIST circuit.

When the transistors 113, 114 are activated, the input/output terminal I11 is connected to the internal terminal 91 via the activated transistors 113, 114 and the inverter circuits 117, 118. When the transistors 111, 112 are activated, the first determination circuit 103*a* outputs a switching signal at a high level. The transistor 115 is activated in response to the switching signal. This connects the input/output terminal I11 to the redundant terminal 94 via the transistor 115 and the inverter circuits 105*a*, 105*b*.

The second switch circuit 104b connects the input/output terminal I12 to either one of the internal terminal 92 and the redundant terminal 94 in accordance with the output signals of the BIST circuit and the second determination circuit 103b. The third switch circuit 104c connects the input/output terminal I13 to either one of the internal terminal 93 and the redundant terminal 94 in accordance with the test signal of the BIST circuit and the switching signal of the second determination circuit 103c. That is, when there is a connection flaw in any one of the internal terminals 91-93, the first switching circuit unit 101 uses the redundant terminal 94 in lieu of the terminal having the connection flaw.

In this state, if there is a connection flaw in any one of the internal terminals 95-97 of the second chip 14, the second chip 14 also uses the redundant terminal 98 in lieu of the terminal having the connection flaw.

Accordingly, in the second embodiment, when there is a flaw in the connection between the first chip 13 and the second chip 14, remediation of the deficient terminal is enabled.

The first embodiment and the second embodiment may be modified as described below.

The MCP 11 may include three or more of the chips 13, 14.

The MCP 11 may be a plane type MCP in which the first chip 13 and the second chip 14 are arranged side by side and connected to each other on the substrate 12.

The transistors 31-34 of FIG. 2 may be replaced by p-channel MOS transistors.

The configuration of the first switching circuit unit 51 in the first embodiment is not limited to that shown in FIG. 1. For example, when one of the internal terminals 41-44 is determined as being deficient, the switch circuits 54a-54d may switch the connection of the input/output terminals I1-I4 to one of the two associated terminals (i.e., the two associated internal terminals or the associated internal terminal and redundant terminal) in accordance with the output signals of the determination result holding circuits 53a-53d.

Figure 6:
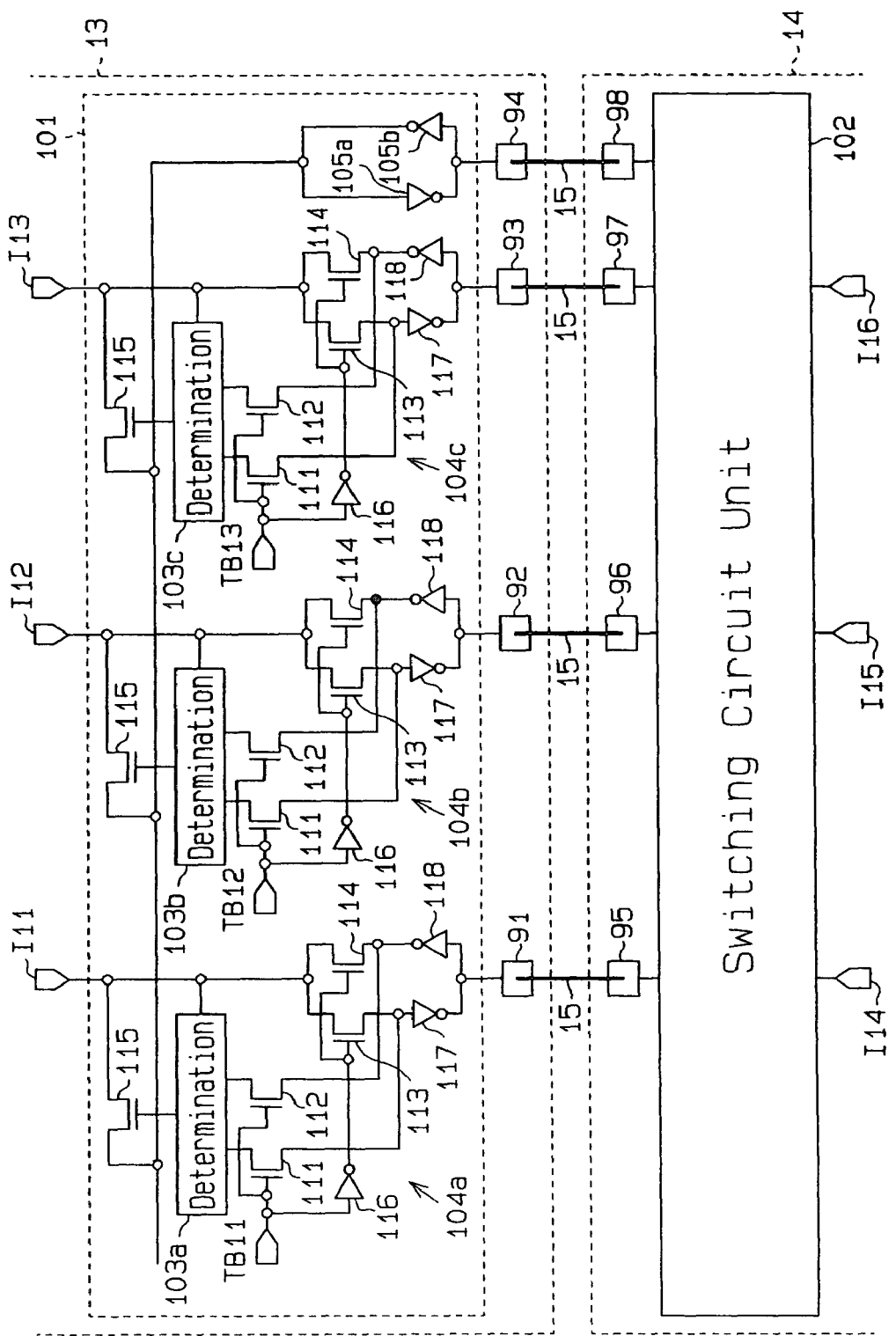
FIG. 6 is a schematic diagram of a circuit for remediating a flaw in a second embodiment of the present invention.

The configuration of the first switching circuit unit 101 in the second embodiment is not limited to that shown in FIG. 6. For example, when one of the internal terminals 91-93 is determined as being deficient, the switch circuits 104a-104d may switch the connection of the input/output terminals I11-I13 from the deficient terminal to the redundant terminal 94 in accordance with the output signal of the BIST circuit.

In the determination result holding circuit 80 of FIG. 5, the output signal of the BIST circuit is held when excessive voltage breaks the fuse 85. However, the output signal of the BIST circuit may be stored and held in, for example, a non-volatile memory.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A semiconductor device comprising at least two semiconductor chips, each having a plurality of internal terminals, the at least two semiconductor chips being connected to one another by each of the plurality of internal terminals, each of the semiconductor chips including:
   at least one redundant terminal;
   a plurality of input/output terminals associated with the plurality of internal terminals;
   a test circuit for detecting whether there is an internal terminal causing a connection flaw and for generating a plurality of test signals, each corresponding to one of the plurality of internal terminals; and
   a switching circuit unit for switching a first set that includes the plurality of internal terminals including the internal terminal causing a connection flaw to a second set, that includes the plurality of internal terminals excluding the internal terminal causing a connection flaw, and includes the at least one redundant terminal so as to connect the second set to the plurality of input/output terminals.

2. The semiconductor device according to claim 1, wherein the switching circuit unit includes:
   a plurality of switch circuits, each connected to an associated one of the input/output terminals and to two terminals selected from the plurality of internal terminals and the at least one redundant terminal;
   a plurality of determination result holding circuits, each connected to an associated one of the switch circuits, wherein the plurality of determination result holding circuits each hold the corresponding test signal and each provide the associated switch circuit with an output signal having a level according to the corresponding test signal, and wherein each of the switch circuits selectively connects the associated input/output terminal to one of the associated two terminals in accordance with the output signal.

3. The semiconductor device according to claim 2, wherein each of the plurality of determination result holding circuits includes a fuse and outputs an output signal having a predetermined level when the fuse of the determination result holding circuit that is associated with the internal terminal causing a connection flaw is broken.

4. The semiconductor device according to claim 1, wherein the switching circuit unit operates in accordance with test signals generated by the test circuit.

5. A semiconductor device comprising at least two semiconductor chips, each having a plurality of internal terminals, each of the semiconductor chips including:
   at least one redundant terminal;
   a plurality of input/output terminals associated with the plurality of internal terminals;
   a test circuit for detecting whether there is an internal terminal causing a connection flaw and for generating a plurality of test signals, each corresponding to one of the plurality of internal terminals; and
   a switching circuit unit for switching the internal terminal causing a connection flaw to the at least one redundant terminal so as to connect the input/output terminal associated with the internal terminal causing a connection flaw to the redundant terminal.

6. The semiconductor device according to claim 5, wherein the switching circuit unit includes:
   a plurality of switch circuits, each connected to an associated one of the input/output terminals and to two terminals selected from the plurality of internal terminals and the at least one redundant terminal;
   a plurality of determination circuits, each connected to an associated one of the input/output terminals to generate a switching signal for switching the associated internal terminal to the redundant terminal in accordance with the corresponding test signal, wherein each of the switch circuits selectively connects the associated input/output terminal to one of the two associated terminals in accordance with the corresponding test signal and switching signal.

7. The semiconductor device according to claim 5, wherein the switching circuit unit operates in accordance with test signals generated by the test circuit.

8. A semiconductor device comprising:
two semiconductor chips, each having a plurality of internal terminals, a first external terminal, and a second external terminal, the plurality of internal terminals including a first internal terminal adjacent to the first external terminal, and a second internal terminal adjacent to the second external terminal with the internal terminals of the two semiconductor chips connected to one another by a plurality of wires, each of the semiconductor chips including:
at least one redundant terminal;
a test circuit for detecting whether there is an internal terminal causing a connection flaw and for generating a plurality of test signals, each corresponding to one of the plurality of internal terminals; and
a switching circuit unit for switching a first set that includes the plurality of internal terminals including the internal terminal causing a connection flaw to a second set, that includes the plurality of internal terminals excluding the internal terminal causing a connection flaw, and includes the at least one redundant terminal;
an intermediate switch device connected between the plurality of internal terminals so that the plurality of wires and the internal terminals are connected in series;
a first end switch device connected between the first internal terminal and the first external terminal; and
a second end switch device connected between the second internal terminal and the second external terminal.

9. A semiconductor device comprising:
at least two semiconductor chips, each having a plurality of internal terminals, a first external terminal, and a second external terminal, the plurality of internal terminals include a first internal terminal adjacent to the first external terminal and a second internal terminal adjacent to the second external terminal, each of the semiconductor chips including:
at least one redundant terminal;
a test circuit for detecting whether there is an internal terminal causing a connection flaw and for generating a plurality of test signals, each corresponding to one of the plurality of internal terminals; and
a switching circuit unit for switching the internal terminal causing a connection flaw to the at least one redundant terminal;
an intermediate switch device connected between the plurality of internal terminals so that the plurality of wires and the internal terminals are connected in series;
a first end switch device connected between the first internal terminal and the first external terminal; and
a second end switch device connected between the second internal terminal and the second external terminal.

10. A semiconductor package comprising a semiconductor device including at least two semiconductor chips, each semiconductor chip comprising:
a plurality of internal terminals, the two semiconductor chips being connected to one another by each of the plurality of internal terminals;
at least one redundant terminal;
a plurality of input/output terminals associated with the plurality of internal terminals;
a test circuit for detecting whether there is an internal terminal causing a connection flaw and for generating a plurality of test signals, each corresponding to one of the plurality of internal terminals; and
a switching circuit unit for switching a first set that includes the plurality of internal terminals including the internal terminal causing a connection flaw to a second set, that includes the plurality of internal terminals excluding the internal terminal causing a connection flaw, and includes the at least one redundant terminal so as to connect the second set to the plurality of input/output terminals.

11. The semiconductor package according to claim 10, wherein the switching circuit unit includes:
a plurality of switch circuits, each connected to an associated one of the input/output terminals and to two terminals selected from the plurality of internal terminals and the at least one redundant terminal;
a plurality of determination result holding circuits, each connected to an associated one of the switch circuits, wherein the plurality of determination result holding circuits each hold the corresponding test signal and each provide the associated switch circuit with an output signal having a level according to the corresponding test signal, and wherein each of the switch circuits selectively connects the associated input/output terminal to one of the associated two terminals in accordance with the output signal.

12. A semiconductor device comprising:
a first semiconductor chip;
a second semiconductor chip connected to the first semiconductor chip by a plurality of wires, wherein each of the first and second semiconductor chips include;
a plurality of input/output terminals;
a plurality of internal terminals associated with the plurality of the input/output terminals;
at least one redundant terminal, wherein the at least one redundant terminal and the internal terminals are connected to the wires, and the number of redundant terminals of the first semiconductor chip is the same as the number of redundant terminals of the second semiconductor chip;
a test circuit for detecting an internal terminal causing a connection flaw from the plurality of internal terminals; and
a switching circuit unit for switching the internal terminals including the internal terminal causing a connection flaw to the internal terminals excluding the internal terminal causing a connection flaw and to the at least one redundant terminal so as to connect the input/output terminals to the internal terminals excluding the internal terminal causing a connection flaw and to the at least one redundant terminal when detecting the internal terminal causing a connection flaw.

13. The semiconductor device according to claim 12, wherein the first semiconductor chip is superimposed on the second semiconductor chip.

14. The semiconductor device according to claim 12,
wherein the first and second semiconductor chips each have a first external terminal and a second external terminal,
wherein the plurality of internal terminals of each semiconductor chip includes a first internal terminal adjacent to the first external terminal, and a second internal terminal adjacent to the second external terminal,
wherein the test circuit of each semiconductor chip detects whether there is an internal terminal causing a connection flaw and generates a plurality of test signals, each corresponding to one of the plurality of internal terminals,
wherein the switching circuit unit of each semiconductor chip switches a first set, that includes the plurality of internal terminals including the internal terminal causing a connection flaw, to a second set, that includes the plurality of internal terminals excluding the internal terminal causing a connection flaw, and includes the at least one redundant terminal;
and wherein the semiconductor device further comprising:
an intermediate switch device connected between the plurality of internal terminals so that the plurality of wires and the internal terminals are connected in series;
a first end switch device connected between the first internal terminal and the first external terminal; and
a second end switch device connected between the second internal terminal and the second external terminal.

* * * * *